(12) United States Patent
Yamane et al.

(10) Patent No.: US 6,838,164 B2
(45) Date of Patent: Jan. 4, 2005

(54) METHOD AND APPARATUS FOR FABRICATING CIRCUIT-FORMING-SUBSTRATE AND CIRCUIT-FORMING-SUBSTRATE MATERIAL

(75) Inventors: Shigeru Yamane, Hirakata (JP); Toshihiro Nishii, Hirakata (JP); Shinji Nakamura, Katano (JP); Masayuki Sakai, Minamikawachi-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/128,418

(22) Filed: Apr. 24, 2002

(65) Prior Publication Data

US 2002/0112815 A1 Aug. 22, 2002

Related U.S. Application Data

(62) Division of application No. 09/355,455, filed as application No. PCT/JP98/05481 on Dec. 4, 1998, now Pat. No. 6,409,869.

(30) Foreign Application Priority Data

Dec. 8, 1997 (JP) .............................................. 9-336838

(51) Int. Cl.[7] ................................................. B32B 5/06
(52) U.S. Cl. ....................... 428/297.4; 428/901; 442/169
(58) Field of Search ............................... 428/297.4, 901, 428/209; 442/169

(56) References Cited

U.S. PATENT DOCUMENTS

| 3,953,663 A | 4/1976 | Kelhm, Jr. ................. 174/68.5 |
| 3,988,408 A | 10/1976 | Haining et al. ............. 264/156 |
| 4,786,528 A | 11/1988 | Amelio et al. ............... 427/289 |
| 4,851,613 A * | 7/1989 | Jacques ....................... 174/68.5 |
| 5,350,621 A | 9/1994 | Yuhas et al. ................. 428/901 |
| 5,599,611 A | 2/1997 | Afzali-Ardakani et al. . 442/180 |
| 6,143,116 A | 11/2000 | Hayashi et al. .............. 156/252 |
| 6,261,414 B1 * | 7/2001 | Kato et al. ................... 162/146 |
| 6,319,605 B1 * | 11/2001 | Murayama et al. ......... 428/395 |
| 6,518,515 B2 * | 2/2003 | Nishii et al. ................. 174/262 |

FOREIGN PATENT DOCUMENTS

| JP | 60236728 | 11/1985 |
| JP | 4-267584 | 9/1992 |
| JP | 08302213 | 11/1996 |
| JP | 9-205266 | 8/1997 |

OTHER PUBLICATIONS

Surface Mounting Technology, No. 1, pp 2–10; Kiyoshi Takagi, 1997 "Significant Trends, the Development of Buildup Multilayered PWBs".

* cited by examiner

*Primary Examiner*—Cathy F. Lam
(74) *Attorney, Agent, or Firm*—Parkhurst & Wendel, L.L.P.

(57) ABSTRACT

A method for manufacturing a printed wiring board, comprising the step of forming a hole by an energy beam such as a laser beam, wherein formation of a resin film by a substrate-material resin oozing to the inner-wall surface of a hole is prevented, by lowering the water-absorption percentage of a substrate material through the dehumidifying step as the preprocess of the hole-forming step for forming a through-hole or non-through-hole for interconnecting circuits formed on both sides or in multiple layers, thereby it is possible to realize high-quality hole-formation by preventing a defective resin film formation and obtain a high-reliability printed wiring board.

3 Claims, 6 Drawing Sheets

(a)

(b)

(c)

(a)

(b)

Heat-sealed portion

METHOD AND APPARATUS FOR FABRICATING CIRCUIT-FORMING-SUBSTRATE AND CIRCUIT-FORMING-SUBSTRATE MATERIAL

This is a divisional of application Ser. No. 09/355,455 filed Sep. 15, 1999, now U.S. Pat. No. 6,409,869.

TECHNICAL FIELD

The present invention relates to a method for manufacturing a quality printed wiring board of high reliability using an energy beam, such as a laser beam, for hole-formation. Manufacturing equipment and board material for the printed wiring board are also included in the invention.

BACKGROUND ART

In order to meet the needs in the recent electronic appliance industry for mounting components in high density in a compact space, the increasing number of printed wiring boards is shifting from the conventional single-sided version towards the double-sided and those having multi-layers. Thus the development efforts are focused on producing a high density printed wiring board that can accept as many wiring circuits thereon.

For forming a fine hole (approximately 200 μm diameter, for example) at a high speed, use of an energy beam, such as a laser beam, is being studied in place of the conventional through-hole making with a drill (Kiyoshi Takagi: "Significant Trends, the Development of Buildup Multilayered PWBs", Surface Mounting Technology, No.1, pages 2–10 (1997); and other publications). Examples of the board material include a film of thermosetting resin at B-stage state containing uncured component, and a composite material of woven, or nonwoven, organic or inorganic fabric and thermosetting resin.

A conventional process comprises a hole forming step and a connection means forming step, as shown in FIG. 5. The aim of forming a hole in a wiring board is to interconnect the circuits provided on the surfaces or in the inner layers of a wiring board. The interconnection means is formed by filling the hole with a conductive paste or by applying a plating process. For example, a both-surface type printed wiring board is produced by first filling a through-hole of the board with a conductive paste containing electroconductive particles by way of a printing or the like process, and then copper foil is provided on both surfaces of the board to be unitized by thermal compression. The copper foils are then made to have specific patterns. The board material is required to become soft or molten at the thermal compression; so, a B-stage thermosetting resin containing uncured component or a thermoplastic resin is used.

When forming a hole in a wiring board of the above described material with an energy beam, such as a laser beam, a resin 2 and a woven, or nonwoven, fabric 3 contained in the board material 1 are heated by the beam and sublimated to be scattering around, and a hole 5 is formed. Resin material existing around the hole is also softened and molten by a heat of low-energy beam that does not contribute to perforating a hole, which resin material oozing out from the wall surface of the hole forms a thin film to cover a part or the whole of the wall surface, as illustrated in FIG. 6(a).

In a case when the resin material of the board absorbs moisture, it is soften and molten more easily by the heat of an energy beam, and volume of the oozing resin increases. As volume of the absorbed moisture increases, the oozing resin comes into contact to each other as shown in FIG. 6(b), which is then solidified and contracted after cooling to form a thin resin film 10, eventually clogging the through-hole 5. This phenomenon becomes significant with the holes of small diameter.

FIG. 7 is a chart showing a concept of relationship between percentage of water absorbed in the board material 1 and rate of rejects due to formation of resin film 10. As soon as the percentage of water absorbed in the board material (water absorbed versus board material 1 in terms of weight; hereinafter referred to as wt %) exceeds a certain point the reject rate sharply picks up. The reject rate and the percentage of absorbed moisture in the threshold value vary depending on the hole diameter and the board material 1. In the through-holes 5 having such a resin film 10 formed therein, troubles in the electrical interconnection often arise in a subsequent process step. Examples of the trouble include; no electrical connection accomplished between the circuits of both surfaces or layers of a wiring board because of incomplete formation of the conductive material or the plating through the opposite surface of a board, the hole not filled with sufficient amount of conductive material, a high contact resistance in an accomplished interconnection, etc.

The present invention aims to offer a manufacturing method, a manufacturing equipment and a board material for producing reliable printed wiring boards having quality holes. In accordance with the invention, rejects due to the formation of resin film is eliminated, or at least reduced, to an improved production yield rate.

DISCLOSURE OF THE INVENTION

The present invention relates to a method for manufacturing a printed wiring board. The method comprises steps of forming a through-hole, or a non-through-hole, with an energy beam in a board material of plate form, or sheet form, composed mainly of either a thermoplastic resin or a thermosetting resin containing uncured component, or a mixture of both, or in a board material of plate form, or sheet form, made of a woven, or nonwoven, fabric impregnated with a material composed mainly of either the thermoplastic resin or thermosetting resin containing uncured component, or a mixture of both, forming connection means in the through-hole, or nonthrough-hole, provided by the hole-forming step, for electrically interconnecting one surface and the reverse surface of the board material, and dehumidifying the board material before the hole-forming step.

Under the manufacturing process in accordance with the present invention, production yield rate is improved through a reduced rate of rejects due to the formation of resin film during the hole-forming step. A high quality hole formation is realized and a high-reliability printed wiring board is obtained.

BEST MODE FOR CARRYING OUT THE INVENTION

Figure 1:
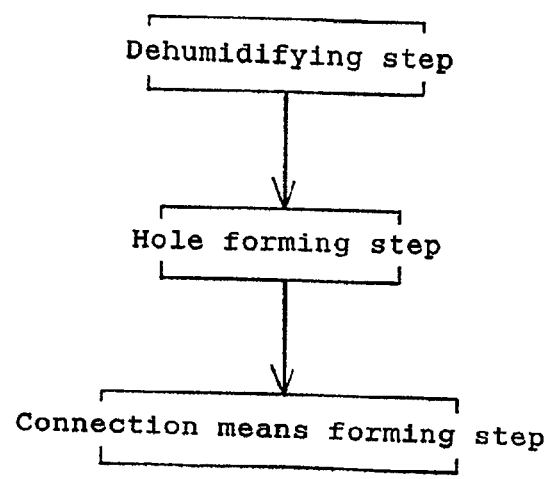
FIG. 1 is a flowchart showing the process in accordance with a first exemplary embodiment of the present invention.

A method for manufacturing a printed wiring board in accordance with the present invention comprises the steps of forming a through-hole, or a non-through-hole, with an energy beam in a board material of plate form, or sheet form, composed mainly of either a thermoplastic resin or a thermosetting resin containing uncured component, or a mixture of both, or in a board material of plate form, or sheet form, made of a woven, or nonwoven, fabric impregnated with a material composed mainly of the thermoplastic resin or thermosetting resin containing uncured component, or a mixture of both, forming connection means in the through-hole, or non-through-hole, provided by the hole-forming step for electrically interconnecting one surface and the reverse surface of the board material, and dehumidifying the board material before the hole-forming step. With the above method of manufacture, rate of rejection due to the formation of resin film at the hole-forming step is reduced, and high-quality hole-formation is realized to obtain a high-reliability printed wiring board.

Preferably, the dehumidifying step is a hot air drying process. Thereby, a board material of high moisture absorption rate can be surely dehumidified with ease.

Preferably, temperature of the hot air drying process is 50° C. or higher, and not higher than a limitation of temperature and time period in which the gel time of thermosetting resin does not start shifting. Thereby, a board material of high moisture absorption rate can be surely dehumidified with ease in a relatively short period of time, without inviting a change in the material property of the board material.

Preferably, the dehumidifying step is a vacuum drying process. Thereby, a board material of high moisture absorption rate can be surely dehumidified with ease.

Preferably, the vacuum drying is performed without accompanying a heating. Thereby, a board material of high moisture absorption rate can be surely dehumidified easily, without inviting a change in the material property of the board material.

Preferably, the vacuum drying process is accompanied by a heating. Thereby, a board material of high moisture absorption rate can be dehumidified efficiently within a short period of time.

Preferably, the heating temperature is at least lower than boiling point of a solvent contained in a resin of board material, and lower than a limitation of temperature and time period in which the gel time of thermosetting resin does not start shifting. Thereby, a board material of high of moisture absorption rate can be dehumidified without inviting bubbling of impregnated resin which might be caused by evaporation of solvent, and without inviting a change in the material property of the board material.

Preferably, degree of the vacuum ambient is not lower than 100 Torr. Thereby, the dehumidifying is conducted efficiently within a short period of time.

Preferably, the dehumidifying is performed at once with two or more pieces of board materials stacked together direct to each other. Thereby, the plurality of board materials may be efficiently dehumidified, which is a substantial advantage in volume production.

Preferably, the dehumidifying step brings the content of water in the board material to be not larger than 1% in terms of weight percentage. Thereby, rejects due to the formation of resin film is prevented, and high-quality hole-formation is realized. The reliability level of a printed wiring board is improved.

A method for manufacturing a printed wiring board in accordance with the present invention comprises the steps of forming a through-hole, or a non-through-hole, with an energy beam in a board material of plate form, or sheet form, composed mainly of either a thermoplastic resin or a thermosetting resin containing uncured component, or a mixture of both, or in a board material of plate form, or sheet form, made of a woven, or nonwoven fabric, impregnated with a material composed mainly of either said thermoplastic resin or thermosetting resin containing uncured component, or a mixture of both, forming connection means in said through-hole, or non-through-hole, provided by said hole-forming step for electrically interconnecting one surface and the reverse surface of the board material, and suppressing moisture absorption of said board material before said hole-forming step. With the above method of manufacture, moisture absorption during storage on shelf can be suppressed; as a result, rejects due to the formation of resin film in the hole-forming step is reduced, and high-quality hole-formation is realized. The reliability of a printed wiring board is improved.

Preferably, the step of suppressing moisture absorption is provided in either between the dehumidifying step and the hole-forming step or in the hole-forming step, or in both steps. By so doing, moisture absorption in the hole-forming step is also suppressed.

Preferably, the process of suppressing the moisture absorption is conducted by storing a board material on shelf in a low humidity atmosphere. By so doing, the absolute humidity goes down and the percentage of water content in a board material is lowered.

Preferably, ambient temperature of the hole-forming step is higher than dew point temperature of the low humidity atmosphere. Under such environment, there will be no dew condensation on a board material.

Preferably, the low humidity atmosphere is a vacuum ambient. Under such state, the absolute humidity can easily be lowered and the percentage of water content of a board material can be lowered.

Preferably, the vacuum ambient is a hermetically sealed space which is evacuated after a board material is lodged in. By so doing, the absolute humidity can easily be lowered and maintained.

Preferably, the low humidity atmosphere is a hermetically sealed, or a circulating, space substituted with dry nitrogen. This provides a simple method for suppressing the moisture absorption during storage on shelf.

Preferably, the process of suppressing moisture absorption keeps content of water in a board material to be 1% or lower in terms of weight percentage. By so doing, rejects due to the formation of resin film is prevented, and high-quality hole-formation is realized. The reliability level of a printed wiring board is improved.

Preferably, the low humidity atmosphere is an atmosphere in which the partial pressure of water vapor is not larger than 10 mmHg. Under such atmosphere, content of water in the board material after storage on shelf never goes higher than 1% in terms of weight percentage, regardless of the time period it stayed on shelf.

A method for manufacturing a printed wiring board in accordance with the present invention comprises the steps of forming a through-hole, or a non-through-hole, with an energy beam in a board material of plate form, or sheet form, composed mainly of a thermoplastic resin or a thermosetting resin containing uncured component, or a mixture of both, or in a board material of plate form, or sheet form, made of a woven, or nonwoven, fabric impregnated with a material composed mainly of said thermoplastic resin or thermosetting resin containing uncured component, or a mixture of both, and forming connection means in said through-hole, or non-through-hole, provided by said hole-forming step for electrically interconnecting one surface and the reverse surface of a board material, wherein said board material stored on shelf is carried to the hole-forming step within a time period in which the water content in said board material does not go beyond 1% in terms of weight percentage. Under the above described manufacturing method, the moisture absorption may be suppressed only through the simple control of time.

Preferably, the board material is laminated at least on both surfaces with sheet film having a high anti-moisture permeability until it is carried to the hole-forming step. By so doing, the moisture absorption can be suppressed regardless of the absolute humidity of storage environment.

Preferably, the board material is laminated at both surfaces with film sheets having a high anti-moisture permeability whose size is greater than the shape of board material, and said film sheets covering the both surfaces are sealed together by heat in the area exceeding outer edge of the board material so that the board material is isolated from the outside air until it is carried to the hole-forming step. By so doing, moisture absorption of a board material from the end can also be suppressed during storage on shelf.

Preferably, the sheet film having a high anti-moisture permeability is of polyethylene terephthalate. It is inexpensive and recyclable.

Preferably, the film is provided with a metal film formed on the surface by deposition or the like method. The use of such a film suppresses the moisture absorption during storage on shelf more effectively.

Preferably, the metal film is of aluminum. It is inexpensive.

Preferably, the energy beam is a laser beam. The laser beam has a good concentration property on a board material, and it can be scanned easily with an optical device or the like means.

Preferably, the laser beam is a $CO_2$ laser beam. It provides a high energy at low cost.

Preferably, the process of filling the through-hole, or non-through-hole, provided by the hole-forming step with a paste containing conductive particles is included in the connection means forming step. By so doing, rejects due to the formation of resin film in the hole-forming step can be reduced, and high-quality hole-formation is realized to an improved reliability of a printed wiring board.

Preferably, the process of providing a board material filled with a paste containing conductive particles with a metal foil on one surface, or both surfaces, to be unitized together by thermal compression is included in the connection means forming step. By so doing, rejects due to the formation of resin film in the hole-forming step can be reduced, and high-quality hole-formation is realized to an improved reliability of a printed wiring board.

Preferably, the process of providing the through-hole, or non-through-hole, formed by the hole-forming step with a plating of conductive metal is included in the connection means forming step. By so doing, rejects due to the formation of resin film in the hole-forming step can be reduced, and high-quality hole-formation is realized to an improved reliability of a printed wiring board.

Preferably, the thermosetting resin is an epoxy resin. It has an improved anti-moisture property.

Preferably, the woven, or nonwoven, fabric is made mainly of organic fiber material. The use of organic fiber, which has a relatively close material property to the resin, makes the hole-formation with an energy beam easy.

Preferably, the organic fiber material is mainly of an aromatic polyimide fiber. It makes the hole-formation with an energy beam easy, and the printed wiring board lighter in weight and more reliable.

An equipment for manufacturing a printed wiring board in accordance with the present invention forms a through-hole, or non-through-hole, in a board material of printed wiring board with an energy beam generated from an energy beam generating unit, wherein the dehumidifying means is provided in a section for feeding said board material. With the above described manufacturing equipment, rejects due to the formation of resin film in the hole-forming step is reduced, and high-quality hole-formation is realized to an improved reliability of a printed wiring board.

Preferably, the dehumidifying means is a hot air dryer. Thereby, a board material of high moisture absorption can be surely dehumidified with ease.

Preferably, temperature of the hot air drying is not lower than 50° C., and not higher than a limitation of temperature and time period in which the gel time of board material does not start shifting. Thereby, a board material of high moisture absorption rate can be surely dehumidified with ease in a relatively short period of time, without inviting a change in the material property of the board material.

Preferably, the dehumidifying means is a vacuum drying unit. Thereby, a board material of high moisture absorption rate can be surely dehumidified with ease.

Preferably, the vacuum drying unit does not accompany a heating. Thereby, a board material of high moisture absorption rate can be surely dehumidified with ease, without inviting a change in the material property of the board material.

Preferably, the vacuum drying unit accompanies a heating. Thereby, a board material of high moisture absorption rate can be dehumidified efficiently within a short period of time.

Preferably, heating temperature of the vacuum drying unit is set to be at least lower than boiling point of a solvent contained in resin of the board material. Thereby, a board material of high moisture absorption rate can be dehumidified without inviting a bubbling of the impregnated resin, which bubbling is caused by an evaporating solvent, and a change in the material property of the board material.

Preferably, vacuum degree in the vacuum drying unit is set to be not lower than 100 Torr. Thereby, a board material is surely dehumidified efficiently within a short period of time.

Preferably, the dehumidifying means is a unit that is capable of dehumidifying two or more pieces of board materials at once stacking together direct to each other. Thereby, the plurality of board materials may be efficiently dehumidified, which is a substantial advantage in the volume production.

Preferably, the dehumidifying means is a unit that is capable of reducing the content of water absorbed in the board material to be lower than 1% in terms of weight percentage. Thereby, rejects due to the formation of resin film is prevented, and high-quality hole-formation is realized to an improved reliability of a printed wiring board.

An equipment for manufacturing printed wiring board in accordance with the present invention forms a through-hole, or non-through-hole, in a board material for forming printed wiring board with an energy beam generated from an energy beam generating unit, wherein means for suppressing moisture absorption is provided either in a section for feeding said board material or in a section for forming the hole, or in both sections. With the above described manufacturing equipment, rejects due to the formation of resin film in the hole-forming step is lowered, and high-quality hole-formation is realized to an improved reliability of a printed wiring board.

Preferably, in a manufacturing equipment for forming a through-hole, or non-through-hole, in a board material for forming printed wiring board with an energy beam guided from an energy beam generating unit, means for suppressing the moisture absorption is provided either in a section for feeding said board material or in a section for forming the hole, or in both sections. By so doing, the moisture absorption during the hole-forming step can also be suppressed.

Preferably, the means for suppressing moisture absorption is a unit that stores a board material on shelf in a low humidity environment.

Preferably, the low humidity environment is a vacuum state. In the vacuum state, the absolute humidity goes low and the percentage of water content of a board material can be reduced.

Preferably, the vacuum state is a sealed space which is evacuated after a board material is lodged in. In this state, the absolute humidity can easily be lowered and maintained there.

Preferably, the low humidity environment is a hermetically sealed space, or a circulating environment, substituted with dry nitrogen. This provides a simple method of suppressing the absorption of moisture during storage on shelf.

Preferably, the means for suppressing moisture absorption is a unit that keeps the content of water in a board material to be lower than 1% in terms of weight percentage. With such means, rejection due to the formation of resin film is prevented, and high-quality hole-formation is realized to an improved reliability of a printed wiring board.

Preferably, the low humidity environment is an environment where the partial pressure of water vapor is not larger than 10 mmHg. Under such environment, the content of water in a board material never goes higher than 1% in terms of weight percentage, regardless of the time period it stays on shelf.

A material for manufacturing printed wiring board in accordance with the present invention is a board material of plate form, or sheet form, composed mainly of a thermoplastic resin or a thermosetting resin containing uncured component, or a mixture of both, or a board material of plate form, or sheet form, made of a woven, or nonwoven, fabric impregnated with a material composed mainly of said thermoplastic resin or thermosetting resin containing uncured component, or a mixture of both, wherein content of water in said board material being lower 1% in terms of weight percentage. With the above described material, rejects due to the formation of resin film in the hole-forming step are avoidable, and high-quality hole-formation is realized to an improved reliability of a printed wiring board.

Preferably, the board material for manufacturing printed wiring board is the one that fits to the hole-forming with an energy beam. With such a material, rejects due to the formation of resin film in the hole-forming step are avoidable, and high-quality hole-formation is realized to an improved reliability of a printed wiring board.

Preferably, the thermosetting resin is an epoxy group resin. It has an improved anti-moisture property.

Preferably, the woven, or nonwoven, fabric is made mainly of organic fiber material. The use of organic fiber, whose material property is relatively close to the resin, makes the hole-forming with an energy beam easy.

Preferably, the organic fiber material is mainly of an aromatic polyimide fiber. It makes the hole-forming with an energy beam easy, and a printed wiring board lighter in weight and more reliable.

Now in the following, exemplary embodiments in accordance with the present invention are described referring to FIG. 1 through FIG. 4.

(Embodiment 1)

Figure 2:
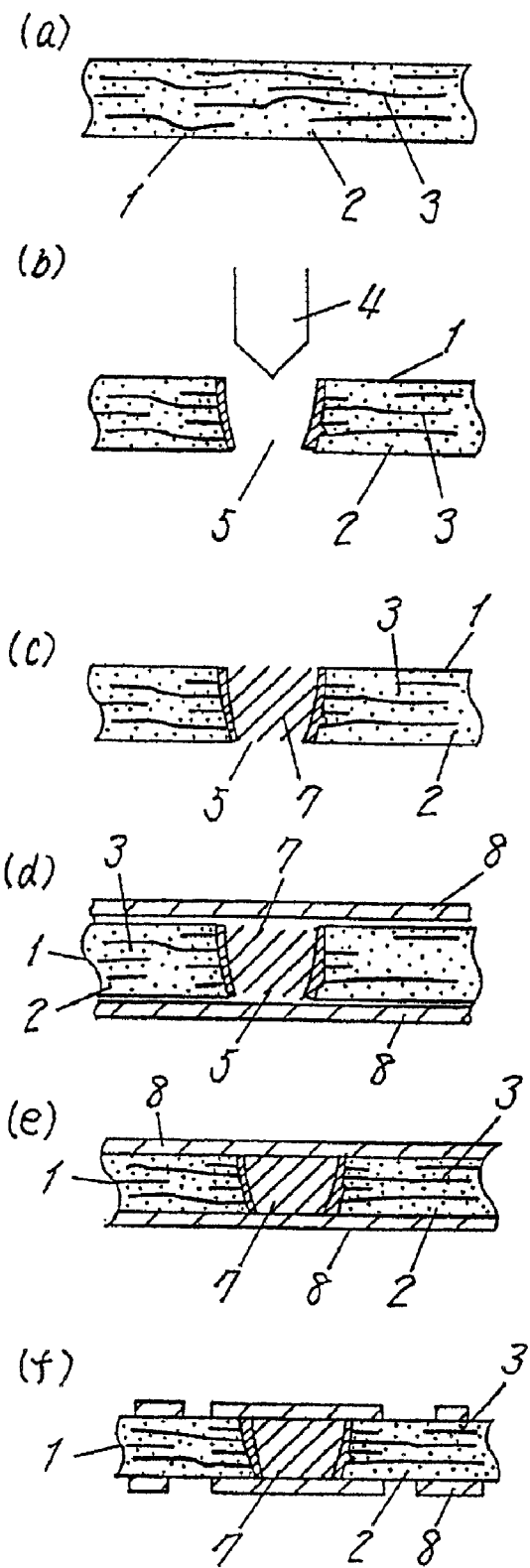
FIG. 2(a)-(f) are cross sectional views illustrating the process of manufacturing a printed wiring board in accordance with the first embodiment of the present invention.

FIG. 1 and FIG. 2, respectively, are process flowchart and cross sectional views showing a method for manufacturing printed wiring board in accordance with a first exemplary embodiment of the present invention. The manufacturing process is composed of a dehumidifying step, a hole-forming step and a connection means formation step, in the order. A board material 1 is a composite material of, as shown in FIG. 2(a), a thermosetting resin 2 (an epoxy resin, for example) and a nonwoven fabric 3 of aromatic polyamide fiber (hereinafter referred to as aramid fiber). The thermosetting resin 2 is not completely cured, but it is in the so-called B-stage state containing non-cured component. The board material 1 is a one which is normally called "prepreg". The board material 1 of approximately 150 $\mu$m thick is dehumidified, and a through-hole 5 is formed in a laser processing unit with a $CO_2$ gas laser beam 4 at a diameter of approximately 200 $\mu$m.

The through-hole 5 is filled with a conductive paste 7 composed mainly of an epoxy resin and conductive particles by a printing method, as shown in FIG. 2(c). Then, as shown in FIG. 2(d), a metal foil 8 is provided on both surfaces of the board material 1 to be unitized together by thermal compression in the direction of thickness. The metal foils 8 overlaid on the both surfaces are electrically interconnected by the conductive paste 7. Each of the metal foils 8 is etched to a certain specific pattern to complete a printed wiring board, FIG. 2(f).

Some of the points of significance with the present embodiment are described below. The dehumidifying is conducted either by an independent dehumidifying unit or dehumidifying means provided in a section of the laser processing unit for feeding board material 1. In practice, a board material 1 that has a high moisture absorbing property may be dehumidified with hot air or vacuum prior to the hole-formation.

In the dehumidifying with hot air, it has been confirmed that higher the hot air temperature the higher the dehumidifying effect, and the dehumidifying process can be finished within a short period of time when the temperature is 50° C. or more. However, in order to prevent adverse influence to the following thermal compression process, it is essential that the board material 1 is treated within a limitation of temperature and time period in which the gel time of thermosetting resin 2 contained in the board material 1 does not make a substantial shift. The term, "gel time", is a parameter representing the progress of curing; it is defined by the length of time: A thermosetting resin 2 of a certain specific weight is placed on a hot plate heated to a certain specific temperature (170° C., for example), stirred with a Teflon or the like stick, a period of time until the thermosetting resin 2 ceases to rope. Normally the dehumidifying with hot air is conducted with the atmospheric air, but the use of dry nitrogen, for example, may lead to a more effective result.

The dehumidifying in vacuum has an advantage that it can dehumidify a board material in the room temperature, without applying heat. Thus, a board material 1 may be dehumidified without inviting any shift in the material property, such as the gel time. If a heat is added during the vacuum dehumidifying, the effect is enhanced and the time needed for dehumidifying will become shorter as compared with the time required in the drying with hot air. Attention has to be paid in order not to leave adverse influence on the thermal compression process; that it has to be processed within a limitation of temperature and time in which the gel time of thermosetting resin 2 contained in the board material 1 does not make a substantial shift.

When the thermosetting resin 2 contains a solvent, the upper limit of the heating temperature should be lower than boiling point of the solvent. If the temperature is not lower than the boiling point, solvent evaporates to result in a bubbling of the thermosetting resin 2, which leaves ill affect to a subsequent process step. Another advantage with the dehumidifying with vacuum is that it can dehumidify at once two or more pieces of board materials 1 of a sheet form stacked together direct to each other. Thus, the vacuum dehumidifying takes only a short period of time for dehumidifying, and provides a high operational efficiency. The process is suitable to the volume production. The process of dehumidifying the board materials 1 in a stacked state is not suitable to the hot air drying, because the dehumidification effect is small in that way and takes too much time, allowing the gel time of board material 1 to shift significantly. It has been confirmed that the vacuum dehumidifying brings about a satisfactory dehumidification effect within a short period of time if grade of the vacuum is not lower than 100 Torr. If the vacuum grade is inferior to the value, it takes too much time for dehumidification, or hardly any dehumidification is obtainable.

The lower the moisture contents in a board material 1, which represents the result of the dehumidifying process, the lower the rate of rejects due to the formation of resin film 10. According to experimental results obtained by the inventor, the rejects are eliminated when the moisture content is not higher than 1 wt % (measured with a Karl Fisher moisture meter). However, as the quantity of thermosetting resin 2 contained in the board material 1 increases, the rejects rate due to formation resin film 10 tends to go higher. So, the moisture content in a board material should ideally be almost zero. In practice, the moisture content should preferably be 0.6 wt % or less, taking the dispersion in the material property of board material 1 into consideration. More preferably, it should be 0.2 wt % or less when taking into account the stability in a volume production line.

(Embodiment 2)

Figure 3:
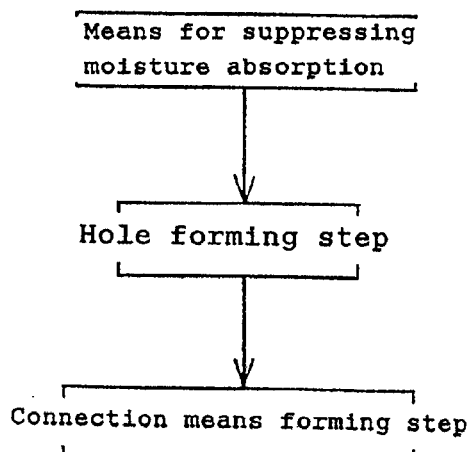
FIG. 3(a)-(c) show process flowcharts in accordance with a second exemplary embodiment of the present invention.
Figure 3:
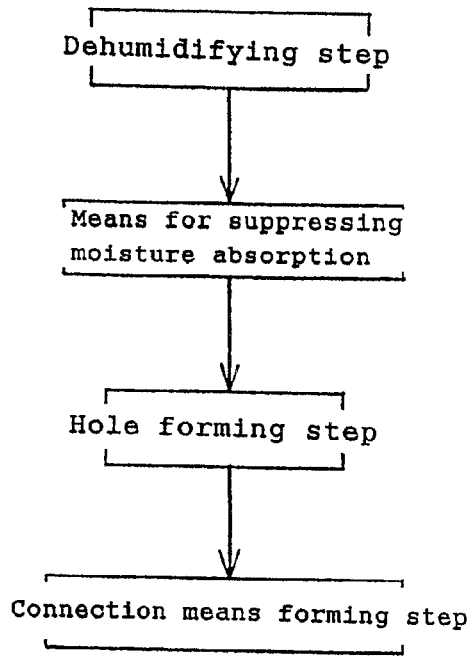
Figure 3:
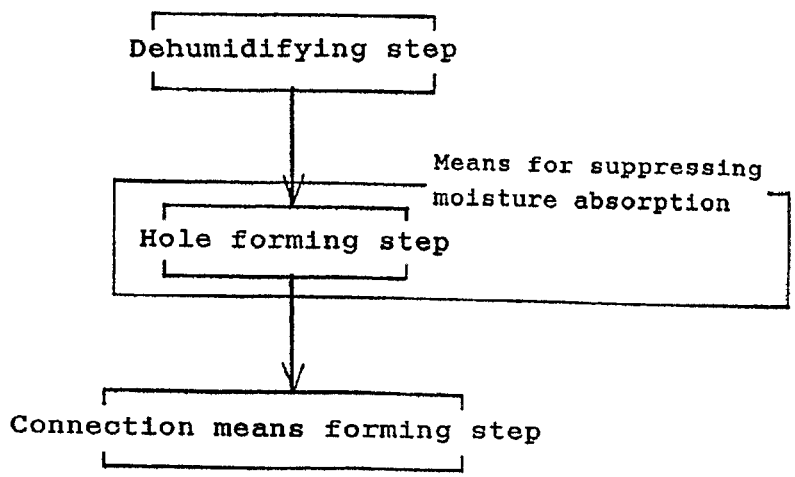
Figure 4:
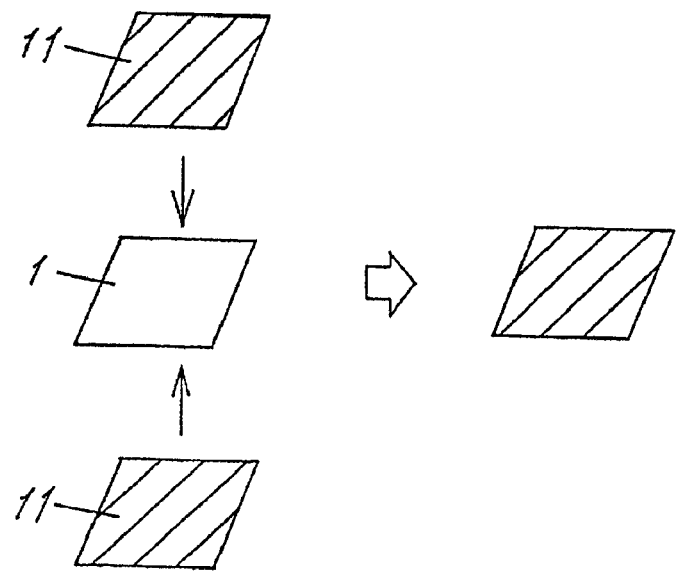
FIG. 4(a), (b) show laminating processes in accordance with a third exemplary embodiment of the present invention.
Figure 4:
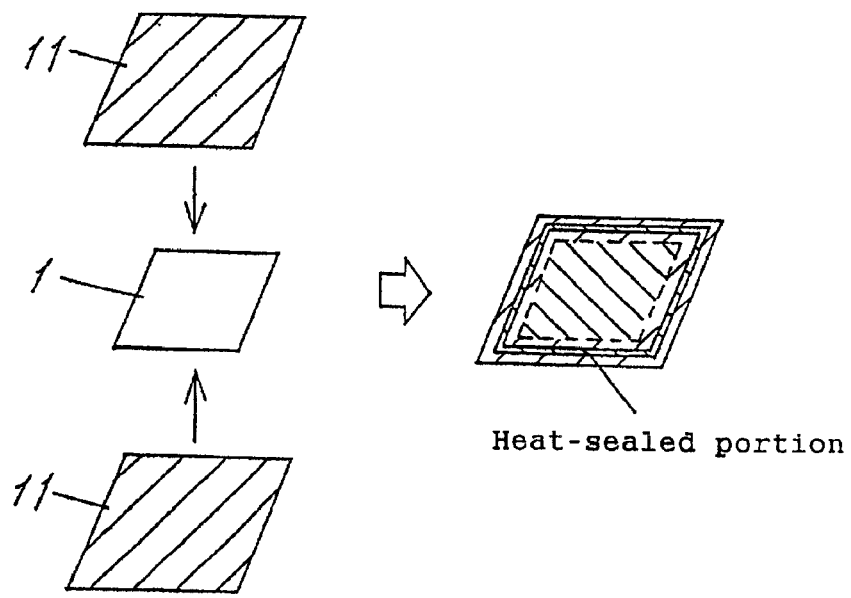
Figure 5:
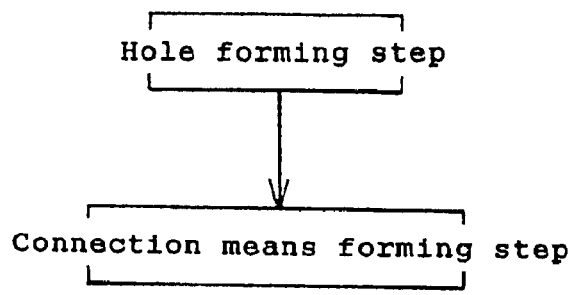
FIG. 5 is a flowchart showing a conventional process.
Figure 6:
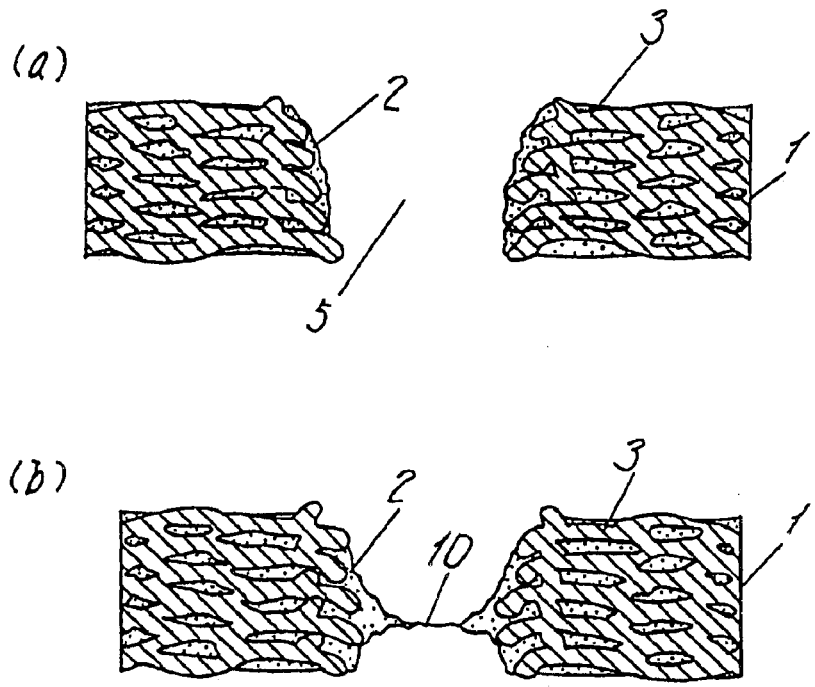
FIG. 6(a), (b) show cross sectional views of a hole formed by a conventional procedure.
Figure 7:
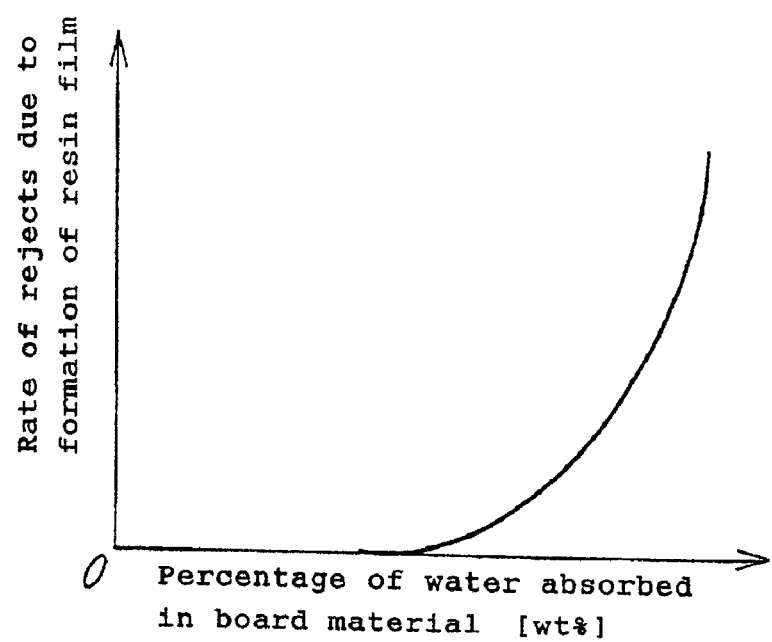
FIG. 7 is a characteristics chart showing the relationship between the rate of rejects due to formation of resin film and the percentage of water absorbed in board material.

FIG. 3 shows process flowcharts of a printed wiring board in accordance with a second exemplary embodiment of the present invention. The process consists of means for suppressing moisture absorption, a hole-forming step and a connection means forming step. There are variations to the process; a case of FIG. 3(a), where the means for suppressing moisture absorption is placed before the hole-forming step, a case of FIG. 3(b), where the means is placed in between the dehumidifying step of embodiment 1 and the hole-forming step, a case of FIG. 3(c), where the means is in the hole-forming step, and a case where the cases of FIG. 3(b) and FIG. 3(c) are combined. Process steps after the hole-forming step are basically the same as those of embodiment 1, therefore detailed description of which steps is omitted.

The points of significance with the present embodiment are described below. The means for suppressing moisture absorption is constituted by an independent moisture suppressing unit, or means for suppressing moisture absorption disposed in a section for feeding the board material 1 or in the hole-forming step of a laser process unit. Practically, the present embodiment is suitable for such board materials 1 whose initial absorption of moisture is relatively low. The moisture absorption can be suppressed by storing the board materials on shelf in a low humidity atmosphere. An air conditioner is generally used to provide the low humidity atmosphere, A simpler alternative may be providing a hermetically sealed space, or a circulating environment, substituted with dry nitrogen. Or, the board material 1 may be placed in a container, and then the container is evacuated after it is hermetically sealed.

In a case where there is a certain time period for a board material 1 dehumidified by the process of embodiment 1 until it is carried to the hole-forming step, it may be stored on shelf in the low humidity atmosphere for suppressing the moisture absorption. It is further effective if the hole-forming step is conducted in a low humidity atmosphere. The point of importance here is that, if environment of the hole-forming step is not low humidity, temperature of the low humidity atmosphere needs to be kept higher than dew point of the environment of the hole-forming step, in order to avoid dew condensation on the board material 1.

Although moisture absorption with a board material 1 is low in the beginning, or it had been dehumidified to a sufficiently low level, it starts absorbing moisture if stored in a certain environment, eventually reaching a certain percentage of water content, which is proportionate to absolute humidity of the atmosphere in which the board material is stored. Experiments conducted by the inventor reveal that the percentage of water content can be maintained below 1 wt % so long as it is stored on shelf in an environment where the partial pressure of water vapor is not higher than 10 mmHg. The moisture absorption never go beyond 1 wt % so long as it is stored in the above described environment, regardless of time span of the storage.

Another practical way of forming a hole in a board material 1 in a state where the moisture contents are not higher than 1 wt % is to processing it before it absorbs moisture to a level higher than 1 wt % during storage on shelf. In this way, means for suppressing the moisture absorption is not required; it is a simple manufacturing method which requires only the control of time.

(Embodiment 3)

Other method for suppressing the moisture absorption of board material 1 is to laminate the both surfaces with a sheet film having a high anti-moisture permeability. Laminating the board material 1 at least on both surfaces with sheet film 11 of anti-moisture permeability, as illustrated in FIG. 4(a), suppresses the moisture absorption. The anti-moisture effect is enhanced by using sheet films 11 that have a greater size than the board material 1, and sealing them together by heat in an area outer than the board material 1. By so doing, the board material 1 is isolated from the outside air and the moisture absorption from the end is also suppressed. Polyethylene terephthalate (PET), which is inexpensive and recyclable, may be a good candidate for the film 11 of anti-moisture permeability. The effectiveness of moisture suppression is further enhanced if the sheet film is provided with a film of aluminum, or the like metal, deposited on the surface.

Although in the above described three exemplary embodiments the allowable contents of moisture in the board material have been specified to be not higher than 1 wt %, effectiveness of the suppressed moisture absorption remains as it is in reducing the rejects due to formation of resin film 10 even if the moisture absorbed is somewhat more than the above specified value. Although $CO_2$ laser has been described as an example of the energy beam, other gas lasers, YAG laser and other solid-state lasers, eximer lasers, or energy beams other than laser may of course be used instead for the purpose. Although the descriptions have been made referring to a double-faced printed wiring board, the present technology is of course applicable to the manufacture of multi-layered printed wiring boards by repeating the process steps. Instead of the nonwoven fabric, a woven fabric may also be used; the nonwoven fabric or woven fabric may also be formed with an organic fiber other than aramid fiber or with an inorganic fiber material such as glass; a thermoplastic resin may also be used in place of the thermosetting resin; the connection means may be provided also by an interconnection formed with plating or pressure welding. Thus, the above-described embodiments are not to be interpreted as limiting.

INDUSTRIAL APPLICABILITY

Providing a dehumidifying step before the hole-forming step brings about a substantial advantage in improving the manufacturing yield rate through the reduced rejects due to formation of resin film. A high-quality hole-formation is realized in a printed wiring board manufactured in accordance with the present invention, and the printed wiring boards thus manufactured are furnished with a high-reliability.

In addition to the above-described advantages, following effects are expected.

As the diameter of a hole goes smaller the oozing resin readily sticks together, which leads to the rejects due to formation of resin film. The present invention advances the smallest limit of the hole diameter a step further. The high-quality hole-formation is realized with the holes of smaller diameters. This technology helps present high-density printed wiring boards at a high manufacturing yield rate.

Furthermore, as the quantity of resin oozing out from the wall surface of a hole decreases the quantity of conductive paste to be filled in the hole increases accordingly, and the compression rate of conductive particles increases in the thermal compression procedure. Thus, high reliability printed wiring boards having low interconnection resistance are presented.

What is claimed is:

1. A printed wiring board material selected from the group consisting of a first material of plate form or sheet form comprising a thermosetting resin, and a second material of plate form or sheet form comprising a woven or nonwoven fabric comprising an organic fiber material impregnated with a thermosetting resin, wherein
    said printed wiring board material has a water content of not more than 0.6% by weight and is one in which holes can be formed with an energy beam.

2. The material of claim 1, wherein the thermosetting resin is an epoxy resin.

3. The material of claim 1, wherein the organic fiber material comprises an aromatic polyamide fiber.

* * * * *